United States Patent
Mason et al.

(10) Patent No.: US 7,310,363 B1
(45) Date of Patent: Dec. 18, 2007

(54) INTEGRATED WAVELENGTH TUNABLE SINGLE AND TWO-STAGE ALL-OPTICAL WAVELENGTH CONVERTER

(75) Inventors: Thomas Gordon Beck Mason, San Jose, CA (US); Gregory Fish, Santa Barbara, CA (US); Daniel J Blumenthal, Santa Barbara, CA (US)

(73) Assignee: The Regents of the University of California, Oakland, CA (US)

( * ) Notice: Subject to any disclaimer, the term of this patent is extended or adjusted under 35 U.S.C. 154(b) by 226 days.

(21) Appl. No.: 10/469,789

(22) PCT Filed: Sep. 28, 2000

(86) PCT No.: PCT/US00/26655

§ 371 (c)(1),
(2), (4) Date: Feb. 13, 2004

(87) PCT Pub. No.: WO01/24329

PCT Pub. Date: Apr. 5, 2001

Related U.S. Application Data (60) Provisional application No. 60/156,459, filed on Sep. 28, 1999.

(51) Int. Cl.
*H01S 5/00* (2006.01)
*H04B 10/04* (2006.01)
(52) U.S. Cl. ..................... 372/50.1; 359/344
(58) Field of Classification Search .......... 372/50, 372/96, 20; 359/344, 332, 160, 279
See application file for complete search history.

(56) References Cited

U.S. PATENT DOCUMENTS 4,957,337 A * 9/1990 Ogawa et al. ............. 385/1

(Continued)

OTHER PUBLICATIONS

Mason et al., Jun. 1999, IEEE Photonics Technology Letters, vol. 11, No. 6, Widely Tunable Sampled Grating DBR Laser with Integrated Electroabsorption Modulator, pp. 1041-1043.*

(Continued)

*Primary Examiner*—Don Wong
*Assistant Examiner*—Hung Tran Vy
(74) *Attorney, Agent, or Firm*—Berliner & Associates (57) ABSTRACT

A semiconductor tunable laser (10) and an interferometer (12) coupled to the tunable laser (10) are monolithically fabricated in a semiconductor heterostructure. The laser also comprises a buried ridge stripe waveguide laser. The interferometer (12) has a semiconductor optical amplifier (38) coupled in each arm. A cross-gain semiconductor optical amplifier converter is coupled to the interferometer (12). The semiconductor optical amplifier (38) coupled in each arm is biased so that an optical path length difference between the two arms is in antiphase which results in destructive interference. The output of the tunable laser (10) is coupled to a coupler. A semiconductor optical amplifier (38) is used as a gain controller for the semiconductor optical amplifiers in the interferometer (12) to allow wavelength conversion over a larger range of input signal powers. The heterostructure substrate comprises a low bandgap waveguide layer and thinner multi-quantum well active regions disposed above the low bandgap waveguide layer. The heterostructure substrate has nonabsorbing passive elements formed therein by selectively removing the quantum wells regions above the waveguide layer to allow formation of active and passive sections in the waveguide layer without having to perform a butt joint regrowth. The invention is also characterized as a method of fabricating an integrated optical device as disclosed above in the heterostructure substrate.

5 Claims, 6 Drawing Sheets

U.S. PATENT DOCUMENTS

| | | | | |
|---|---|---|---|---|
| 5,105,433 | A | * | 4/1992 | Eisele et al. ............. 372/50.21 |
| 5,249,243 | A | * | 9/1993 | Skeie ............................ 385/3 |
| 5,303,079 | A | * | 4/1994 | Gnauck et al. ............. 398/182 |
| 5,355,239 | A | * | 10/1994 | Nakajima .................... 398/138 |
| 5,699,378 | A | * | 12/1997 | Lealman et al. ............ 372/102 |
| 5,808,314 | A | * | 9/1998 | Nakajima et al. ............. 257/17 |
| 5,838,714 | A | * | 11/1998 | Delorme ....................... 372/96 |
| 6,069,732 | A | * | 5/2000 | Koch et al. .................. 359/344 |
| 6,222,964 | B1 | * | 4/2001 | Sadot et al. ................... 385/40 |
| 6,282,005 | B1 | * | 8/2001 | Thompson et al. ......... 398/143 |
| 6,288,410 | B1 | * | 9/2001 | Miyazawa .................... 257/14 |
| 6,577,436 | B2 | * | 6/2003 | Kim ............................ 359/332 |

OTHER PUBLICATIONS

Charil et al, Oct. 1989, Electronic Letters, vol. 25, No. 22, pp. 1477-1478, Extremely Low Threshold Operation of 1.5μm GaInAsP/InP buried Ridge Stripe Lasers.*

* cited by examiner

INTEGRATED WAVELENGTH TUNABLE SINGLE AND TWO-STAGE ALL-OPTICAL WAVELENGTH CONVERTER

RELATED APPLICATIONS

The present application is related to U.S. Provisional Patent Application Ser. No. 60/156,459, filed on Sep. 28, 1999.

This invention is made with Government support under Grant No. N00014-96-6014, awarded by the Office of Naval Research. Grant No. 9896283, awarded by the National Science Foundation and Grant No. F49620-98-1-0399, awarded by the Department of Air Force. The Government has certain rights in this invention.

BACKGROUND OF THE INVENTION

1. Field of the Invention

The invention relates to a method and apparatus for integrated wavelength tunable single and two-stage all-optical wavelength converter.

2. Description of the Prior Art

The current usage of optical components and lasers has made communications and data transfer more efficient and more cost effective. The use of semiconductor lasers has made the fabrication and packaging of optical sources more cost effective, as well as reducing the size of the overall device.

However, the requirements for communications and data transfer systems have also increased. Widely tunable lasers are essential components for a wide variety of wavelength-division multiplexing (WDM) and packet switching network architectures. They can be used as replacement sources in long haul dense WDM communication systems or for wavelength routing in access networks. They are also important devices for next generation phased array radar systems that use true-time delay beam steering. There is a need in such systems for stable monolithic integrated optical frequency converters, but until now none have been available.

BRIEF SUMMARY OF THE INVENTION

The invention is an apparatus comprising a semiconductor heterostructure, a tunable laser fabricated in the semiconductor heterostructure and an interferometer having an input coupled to the output of the tunable laser. The interferometer is monolithically fabricated with the tunable laser in the semiconductor heterostructure.

In the illustrated embodiment the tunable laser is a distributed Bragg reflector laser, although the invention contemplates any type of semiconductor laser now known or later devised. The laser also comprises a buried ridge stripe waveguide laser. The buried ridge stripe waveguide laser comprises two sampled grating DBR mirrors, a gain section and a phase section.

The interferometer has a semiconductor optical amplifier coupled in each its arms. The apparatus further comprises a cross-gain semiconductor optical amplifier converter coupled to the interferometer. The semiconductor optical amplifier coupled in each arm is biased so that an optical path length difference between the two arms is in antiphase which results in destructive interference. The semiconductor optical amplifier is polarization insensitive.

In one embodiment the apparatus has an input to which an input signal, $\lambda_1$, is coupled and a coupler. The polarization insensitive semiconductor optical amplifier has an output coupled to the coupler. The output of the tunable laser is coupled to the coupler. The polarization insensitive semiconductor optical amplifier is used as a gain controller for the semiconductor optical amplifiers in the interferometer to allow wavelength conversion over a larger range of input signal powers.

A dense wavelength division multiplexing communication system with multiple channels is coupled to the output of the interferometer so that the tunable laser can be used to convert between any two of the multiple channels.

The interferometer further comprises a multimode interference coupler characterized by a wavelength insensitive splitting ratio coupled to the input of the interferometer.

The heterostructure substrate comprises a low bandgap waveguide layer and thinner multi-quantum well active regions disposed above the low bandgap waveguide layer. The heterostructure substrate has nonabsorbing passive elements formed therein by selectively removing the quantum wells regions above the waveguide layer to allow formation of active and passive sections in the waveguide layer without having to perform a butt joint regrowth.

In one embodiment an input signal, $\lambda_1$, is coupled thereto and the apparatus further comprises a distributed feedback laser having an output to modulate the input signal, $\lambda_1$. A semiconductor optical amplifier has an output and an input coupled to the input signal, $\lambda_1$, and to the output of the distributed feedback laser. A notch filter has an output and an input coupled to the output of the semiconductor optical amplifier. An input of the interferometer is coupled to the output of the notch filter, so that the input signal, $\lambda_1$, is converted to a desired wavelength via cross phase modulation. A comb filter has its input coupled to the output of the interferometer. The semiconductor optical amplifier has an input coupled to the input signal, $\lambda_1$, and is polarization insensitive. The interferometer is operated at a fixed polarization of an intermediate wavelength. The apparatus further comprises a distributed feedback laser having an output to modulate the input signal, $\lambda_1$. A semiconductor optical amplifier has an input coupled to the input signal, $\lambda_1$, and to the output of the distributed feedback laser. A notch filter has an input coupled to the output of the semiconductor optical amplifier. The input of the interferometer is coupled to the output of the notch filter, so that the input signal, $\lambda_1$, is converted to a desired wavelength via counter propagating cross gain modulation. A comb filter has an input coupled to the output of the interferometer.

The invention is also characterized as a method of fabricating an integrated optical device comprising providing a base structure comprised in turn of a cap layer, a multiquantum well layer disposed beneath the cap layer, a first waveguide layer disposed beneath the multiquantum well layer, and a heterostructure waveguide layer disposed beneath the first waveguide layer. The cap layer and multi-quantum well layer are selectively removed to define a passive section. An MOCVD layer is regrown on the passive section and the remaining portions of the base structure. Optical structures are then selectively formed in the MOCVD layer, the passive section and remaining portions of the base structure.

The step of selectively forming optical structures in the MOCVD layer, the passive section and remaining portions of the base structure comprises forming an active optical device in the remaining portions of the base structure, or more particularly a laser or an optical grating.

The step of selectively forming optical structures in the MOCVD layer, the passive section and remaining portions of the base structure also comprises forming a passive optical device in the passive section, such as a spot size converter.

In the illustrated embodiment, the step of selectively forming optical structures in the MOCVD layer, the passive section and remaining portions of the base structure comprises forming a tunable laser and at least two semiconductor optical amplifiers in the remaining portions of the base structure, an interferometer in the passive section and a waveguide circuit coupling the laser, at least two semiconductor optical amplifiers, and interferometer into an optical circuit to form an at least partially integrated tunable wavelength converter.

Although the invention has been described as a method of steps for the sake of grammatical ease, it is to be expressly understood that the invention is not to be limited by the illustrated embodiment under the construction of 35 USC 112, but is to be defined by the full scope of the claims without limitation to the illustrated embodiments. The invention can be better visualized by turning now to the following drawings wherein like elements are referenced by like numerals.

BRIEF DESCRIPTION OF THE DRAWINGS

FIGS. 4a–4i(4) are simplified cross-sectional diagrams, which illustrate the method by which the optical devices of the invention are fabricated in an integrated fashion.

The invention and its various embodiments can now be better understood by turning to the following detailed description of the preferred embodiments which are presented as illustrated examples of the invention defined in the claims. It is expressly understood that the invention as defined by the claims may be broader than the illustrated embodiments described below.

DETAILED DESCRIPTION OF THE PREFERRED EMBODIMENTS

Figure 1:
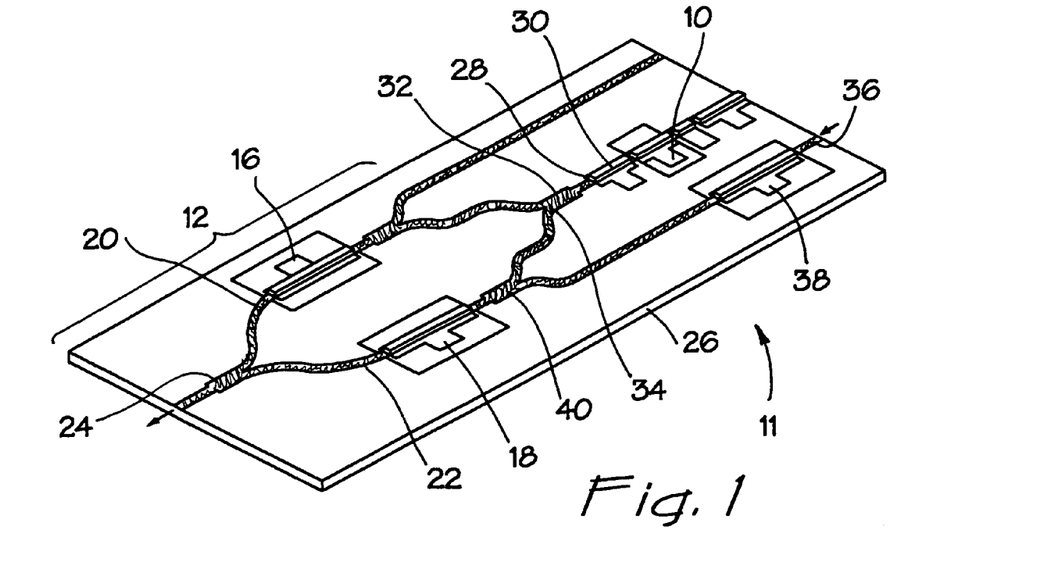
FIG. 1 is a diagrammatic perspective view of a photonic chip in which a single stage wavelength converter has been fabricated.
Figure 3:
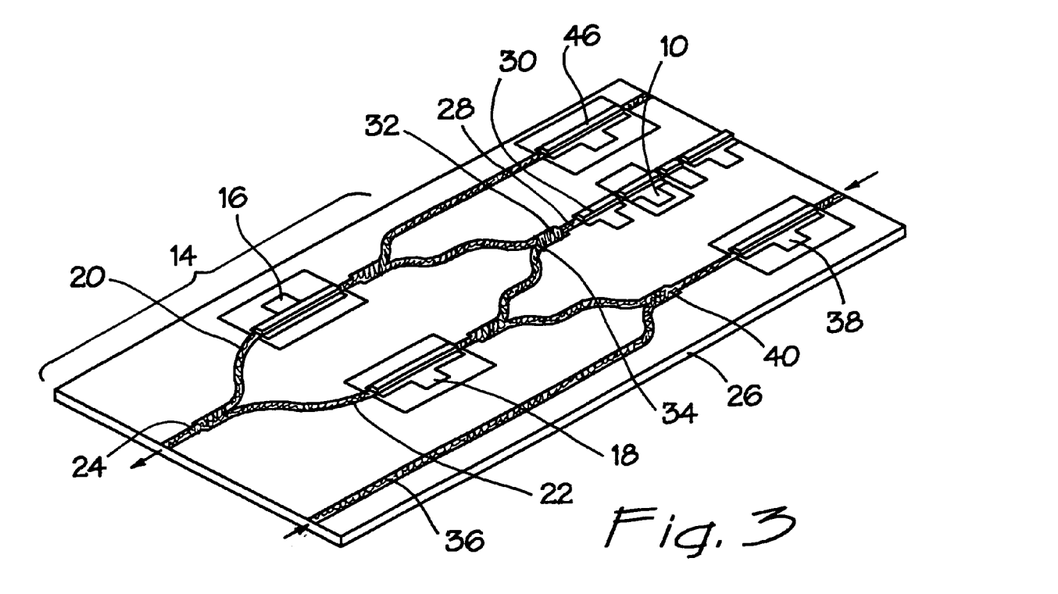
FIG. 3 is a diagrammatic perspective view of a photonic chip in which a two stage wavelength converter has been fabricated in an integrated manner.

This invention is a device and method for performing an all optical wavelength conversion using a tunable laser 10 integrated with single stage and two-stage Mach-Zehnder interferometer converter configurations 12 and 14 respectively best depicted in FIGS. 1 and 3. One aspect of this implementation is integration of a widely tunable sampled grating distributed Bragg reflector (DBR) laser 10 that can be vernier tuned over more than 40 nm and is optically isolated from the wavelength converter sections 12 and 14 due to the DBR mirror section in laser 10. This isolation overcomes fundamental limitations of previous attempts to integrate these devices. See also copending U.S. patent application Ser. No. 10/049,362, entitled "Tunable Laser Source with Integrated Optical Modulator," claiming priority to Provisional Patent Application Ser. No. 60/152,432 filed on Sep. 2, 1999, which are both incorporated herein by reference.

The single-stage wavelength converter 12 in FIG. 1 comprises a Mach-Zehnder interferometer 12 combined with semiconductor optical amplifiers (SOAs) 16 and 18 in each arm 20 and 22 of interferometer 12. The two-stage converter 14 in FIG. 3 is comprised of a cross-gain semiconductor optical amplifier converter followed by the Mach-Zehnder interferometer based converter 16, 18, 20, 22. In the interferometer converter section 16, 18, 20, 22, pumped light from the tunable laser 10 is split evenly between the two arms 20 and 22 of the interferometer 12, 14. The input signal $\lambda_i$ is amplified by semiconductor optical amplifier 38, combined with the output of tunable laser 10 in a coupler 40 and fed to semiconductor optical amplifier 18 in arm 22 of interferometer 12. The optical power fed into semiconductor optical amplifier 18 modifies the transfer function through amplifier 18 resulting in an amplified output signal at $\lambda_i$ and $\lambda_m$. $\lambda_i$ can then be filtered out by a conventional off-chip optical filter (not shown).

Semiconductor optical amplifier 16 is provided in the opposing arm 20 of interferometer 12 to adjust optical path lengths between arms 20 and 22. Amplifiers 16 and 18 can be biased so that the optical path length difference between the two arms 20 and 22 is in antiphase resulting in destructive interference at the output waveguide 24. The input signal, $\lambda_i$, is coupled into a single arm 22 of the interferometer 12, 14. When the input light, $\lambda_i$, is in the high power state, it changes the phase difference between the two arms 20 and 22 and allows light from the pumped beam, $\lambda_m$, to be transmitted.

This method transfers the modulation on the input data signal, $\lambda_i$, to the pumped light, $\lambda_m$, from the tunable laser 10 which can be performed with or without logical bit inversion by selectively operating on the appropriate slope of the transfer curve of semiconductor optical amplifier 18. The input beam, $\lambda_i$, can be filtered out at the output 24 allowing the converted light to be transmitted.

A monolithic tunable wavelength converter 11 has advantages over an implementation based upon discrete components in that it eliminates two fiber pigtails that increase the noise figure due to additional insertion loss and packaging expense. The tunable nature of this implementation also allows one device to be used to optically convert between any two channels in a dense wavelength division multiplexing (DWDM) communication system as opposed to a separate untunable device for each channel.

Figure 2:
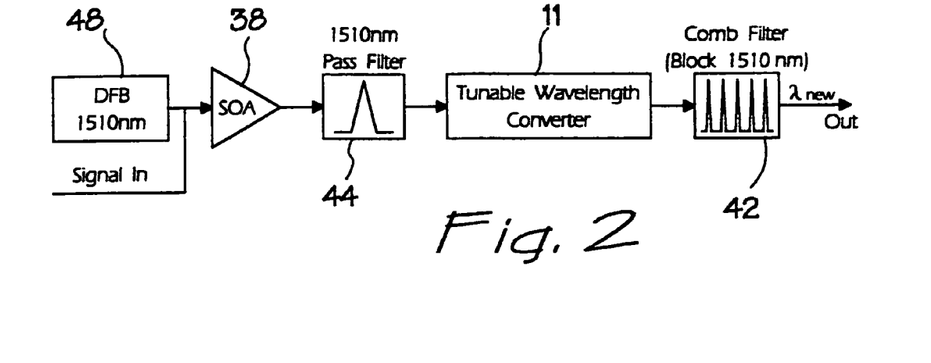
FIG. 2 is a block diagram of the elements of a photonic two stage wavelength converter in which non-integrated components are used.

A feature of the implementation of FIGS. 2 and 3 is the use of an internal wavelength between stages to avoid the need for fast tunable filters and the relaxation of the need for polarization insensitive converters, since the input internal wavelength at which one stage, tunable converter of FIG. 1 operates can be at a fixed polarization state and the second converter stage 16, 18, 20, 22 can be fabricated using polarization sensitive waveguide technology.

There are a number of methods in general which are used to implement wavelength conversion of FIG. 1, e.g. four-wave mixing, cross gain modulation (XGM), and cross phase modulation (XPM). Cross phase modulation in an interferometer 12, 14 employing semiconductor optical amplifiers 16, 18 is considered to be the leading method at this time due to the conversion efficiency, extinction ratio enhancement, and low chirp. It is very attractive to incorporate laser 10 providing the continuous wave light on the same chip 26 as the interferometer 12, 14 due to the elimination of two optical fiber pigtails and the similarity in the fabrication processes required to produce both devices.

It is important that the integrated continuous wave source be insensitive to the back reflections amplified by the semiconductor optical amplifier's 16, 18 in the interferometer 12, 14. To fulfill this requirement a DBR laser 10 should be chosen as the continuous wave source due to the inherent isolation properties of the laser mirrors. An added benefit of the DBR or sampled-grating-distributed-Bragg-reflector (SGDBR) laser 10, is their ability to be electrically tuned to cover several wavelength channels.

In the preferred embodiment the device is comprised of a SGDBR laser 10 coupled to a Mach-Zender interferometer 12, 14 with a polarization insensitive semiconductor optical amplifier 16, 18 located in each the arms 20 and 22 respectively. A schematic of the device is shown in FIG. 1. The laser 10 is a 2 μm wide buried ridge stripe (BRS) waveguide device that is comprised of four separate elements. These separate elements include two sampled grating DBR mirrors and sections for gain and phase control. By controlling the injection current into the sections for gain and phase control, lasers 10 of this type can be made to tune over more than 40 nm with continuous wavelength coverage.

At the output 28 of the front mirror section 30, the laser waveguide 32 is coupled into a 3 dB multimode interference coupler 34 (chosen for its wavelength insensitive splitting ratio) that forms the input of the Mach-Zender interferometer 12, 14. The input signal, $\lambda_i$, is coupled from an optical fiber (not shown) to a waveguide 36 on the integrated optic chip 26. A spot size converter 126 can be used to enhance the efficiency of this coupling. A key feature of this geometry is that the input signal, $\lambda_i$, may be passed through a polarization insensitive semiconductor optical amplifier 38 before being combined in another 3-dB coupler 40 with the continuous wave light from tunable laser 10. This front end semiconductor optical amplifier 38 allows wavelength conversion in the second stage to be performed over a larger range of input signal powers, since it can be used as a gain control element.

As shown in copending U.S. patent application Ser. No. 10/049,362, entitled "Tunable Laser Source with Integrated Optical Modulator," the transverse device structure of optical chip 26 is comprised of a thick low bandgap waveguide layer with multi-quantum well active regions placed above it. The thick low bandgap waveguide layer is necessary for good carrier-induced index change in the tuning sections. Nonabsorbing passive elements are formed by selectively removing the quantum wells from on top of the waveguide layer. The use of the offset quantum wells allows the formation of active and passive sections in a single waveguide layer without having to perform a butt joint regrowth. This, allows the device to be fabricated with only two metal organic chemical vapor deposition (MOCVD) growth steps.

Figure 4A:
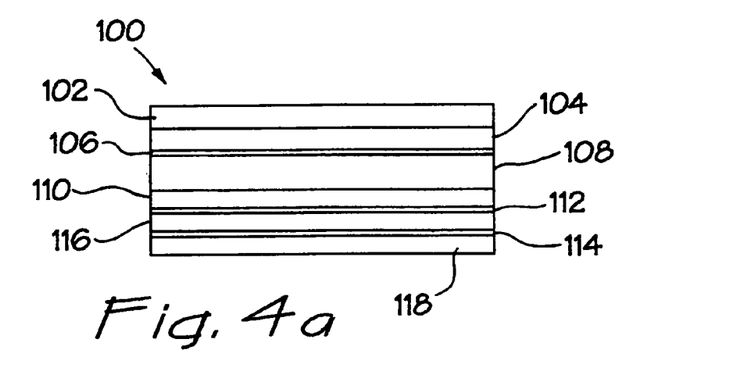

A key advantage of the monolithic wavelength converter is that it can be fabricated using many of the steps already required for tunable lasers 10, making it relatively easy to integrate on chip 26. There are eight main steps in the fabrication procedure for the wavelength converter with the integrated SGDBR laser 10 as shown in FIGS. 4a–4f. In the first step as shown in FIG. 4a, a base structure, generally denoted by reference numeral 100, is grown using near atmospheric metalorganic chemical vapor deposition (MOCVD) with tertiarybutylphosphine and tertiarybutylarsine for the group V sources. In the illustrated embodiment a 0.16 μm Zn doped InP cap layer 102 is disposed on a strained multiquantum well active region 104. A thin 100 Å Si doped InP layer 106 is disposed between multiquantum well active region 104 and a 0.35 μm InGaAsP main waveguide or layer 108 characterized by an bandgap, Eg=0.885 eV. Below InGaAsP waveguide 108 is a 0.5 μm Si doped InP layer 110. Two 0.10 μm InGaAsP waveguides or layers 112 and 114 characterized by an bandgap, Eg=1.127 eV sandwich a 0.5 μm Si doped InP layer 116. Finally, there is a basal InP substrate or layer 118.

Figure 4B:
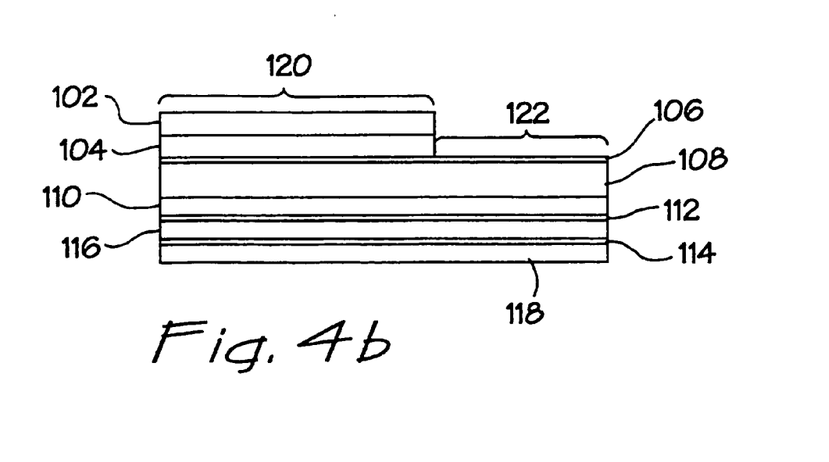

Passive sections in the waveguide layer 108 of chip 26 are formed by selectively etching off the cap layer and then quantum well layer 104 as shown in FIG. 4b. The sectional view of FIG. 4b is in the direction of light propagation. The gratings in laser 10 are formed for the laser mirrors using a dry etch process in region 120 shown in FIG. 4b. Region 120 is where active devices will be fabricated while region 122 is where passive devices will be fabricated. Regions 120 and 122 are covered by a thick MOVCD regrown layer 124 of InP as shown in FIG. 4c.

Figures 4C, 4D:
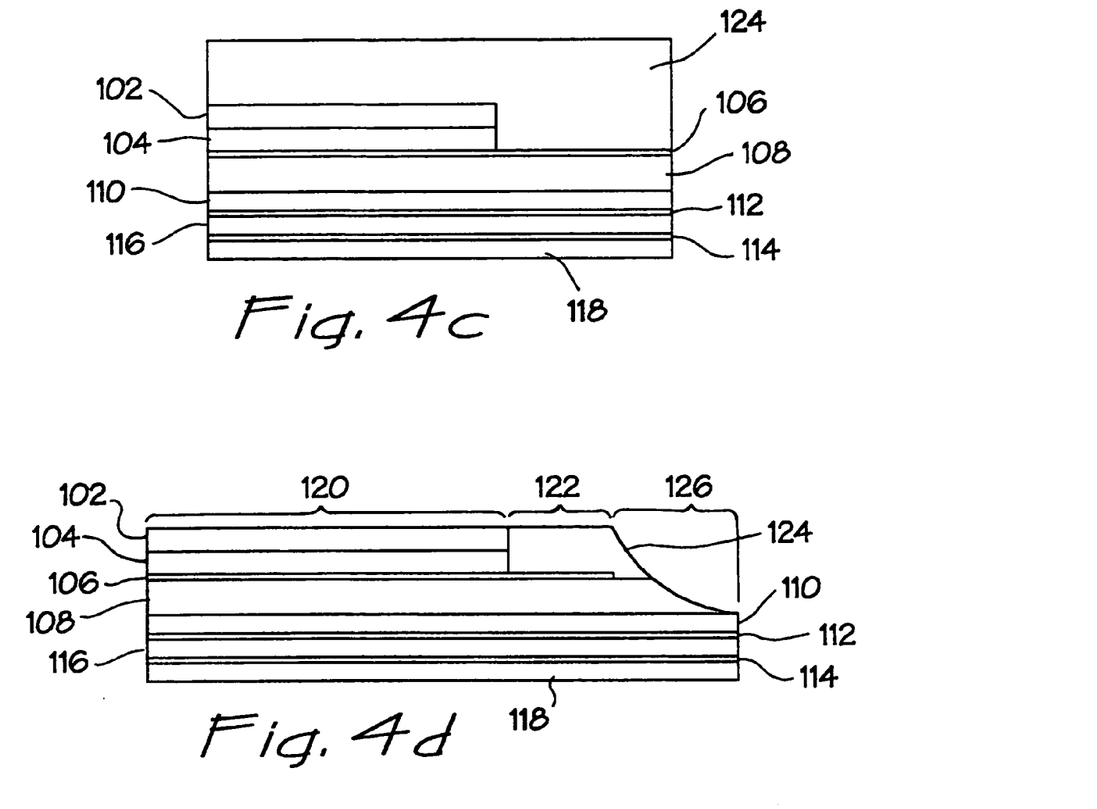

It is also possible to integrate an optical spot size converter 126 at this point into the waveguide layer 108 by performing a diffusion limited etch to taper the thickness of waveguide layer 108 as shown in FIG. 4d before those regions which in which the facets of the laser will be formed.

The DBR mirrors are then formed by opening a window through cap layer 108 and quantum well layer 104. A grating structure 128 is then formed into waveguide layer 108 in chip 26 using selectively reactive ion etching in methane-hydrogen-argon (MHA) as shown in FIG. 4e.

Figure 4E:
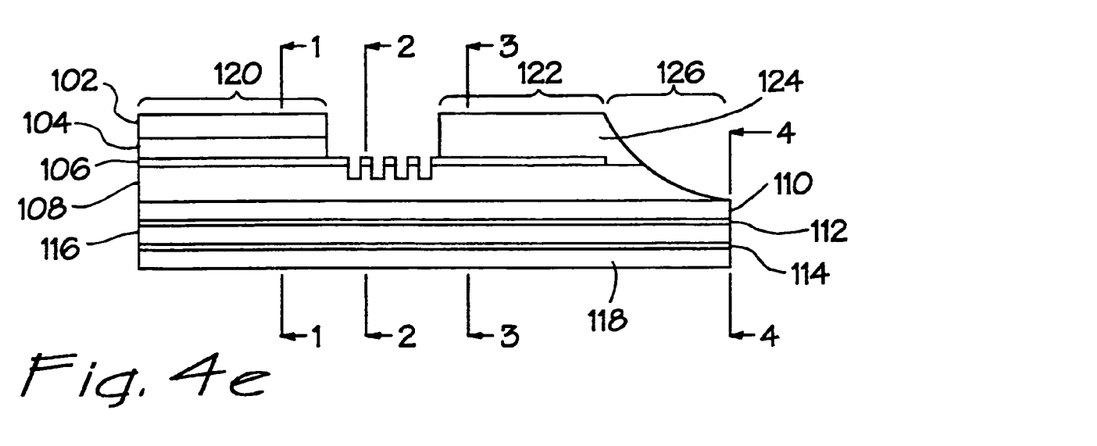
Figure 4F:
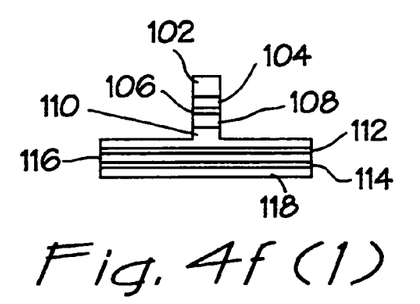
Figure 4G:
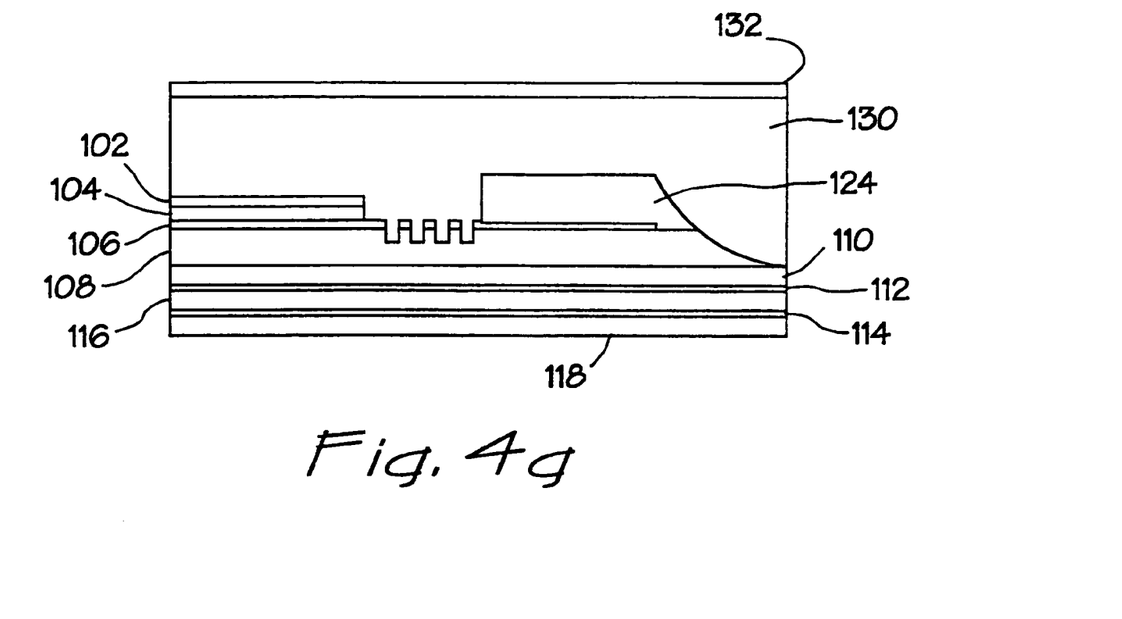

A ridge is patterned into structure 100 using reactive ion etching in methane-hydrogen-argon (MHA) into active section 120, grating section 128, passive section 122 or spot size converter 126 as shown in cross sectional transverse side view taken perpendicularly across the direction of light propagation as shown in FIGS. 4f(1)-4f(4) as would be seen through sectional lines 1—1 to 4—4 of FIG. 4e respectively. A wet etch (Br:Methanol) is used to remove the damaged layer from the reactive ion etch (RIE). In another MOCVD step as shown in FIG. 4g, a 3–4 μm p-InP upper cladding layer 130 and a 100 nm InGaAs contact layer 132 are regrown yielding the structures shown in longitudinal view or in the plane of the direction of light propagation as depicted in FIG. 4g.

Figure 4H:
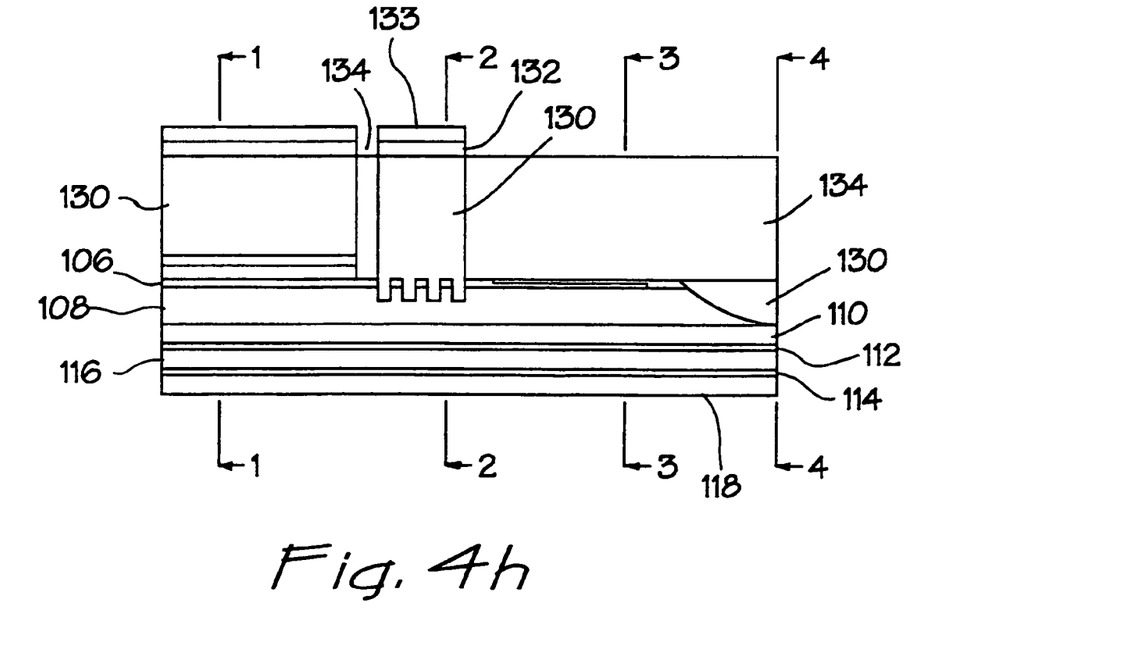
Figure 4I:
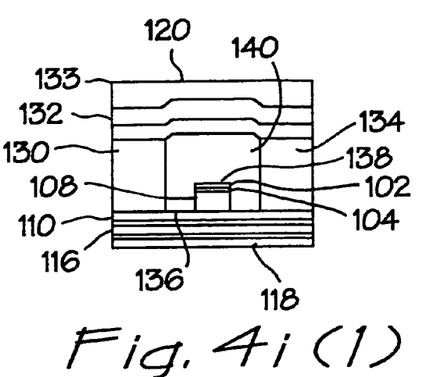

Isolation between the adjacent laser 10 section and between the semiconductor optical amplifier's 16, 18, 38 is achieved by adding a contact layer 133 and etching off the InGaAs layer 132 and performing a deep proton ($H^+$) implant 134 as shown in FIG. 4h. The proton implant is also used to limit the area of the parasitic p-n InP junction 136 shown in FIG. 4i(1) surrounding the buried ridge stripe 138 and to lower the loss in the passive waveguide regions 122 by compensating the Zn acceptor atoms in these areas 140. Active section 120, grating section 128, passive section 122 and spot size converter 126 are shown in cross sectional transverse side view taken perpendicularly across the direction of light propagation as shown in FIGS. 4i(1)-4i(4) as would be seen through sectional lines 1—1 to 4—4 of FIG. 4h respectively. In the final steps, the sample is lapped to 100 pm thick, and a backside contact (not shown) is deposited before cleaving and mounting.

There are several additional considerations that exist for tunable wavelength converter 11, 12, 14 over fixed wavelength converters. It is important to filter out the original signal and amplified spontaneous emission from the converted wavelength that is present at the output of the device. In a fixed wavelength converter the filters can be easily defined to pass only the new wavelength signal. In a tunable device the output wavelength can vary, so a comb filter can be used on the output 24 to pass the desired wavelengths only. Unfortunately, the original wavelength will also pass through the comb filter, so an additional filter is needed to block the original wavelength. This limits the flexibility of the tunable wavelength converter 11 as it can now no longer convert to the same wavelength as the input and the filters need to be specified for a given input wavelength.

A more flexible implementation is illustrated in FIG. 2 where wavelength conversion is performed in two stages. FIGS. 2 and 3 show the device as a combination of an integrated device and off-chip components, but the scope of the invention expressly contemplates that all components of FIG. 2 could be integrally fabricated on chip 26 using the above processes. FIG. 3 depicts the preferred embodiment of a fully integrated device. The first stage converts the signal to an out of band wavelength using distributed feedback (DFB) laser 48 using a cross gain modulation wavelength conversion technique which is then converted to the desired wavelength via cross phase modulation in the tunable wavelength converter 11. There are several advantages to this implementation. The range of usable input signal powers is increased dramatically compared to a single stage cross phase modulation conversion as the output power of the intermediate wavelength can now be controlled in the first wavelength conversion process. Using only a notch filter 44 and a comb filter 42, as illustrated in FIG. 2, any wavelength channel can be converted to any other wavelength channel without adjusting the filters 42 and 44. Conversion to a fixed internal wavelength also allows a choice of only wavelength up- or down-conversion for any input wavelength, $\lambda_i$, allowing the tunable wavelength converter to be optimized for converting from a specific wavelength instead of having to accept any wavelength. Another advantage is the relaxation of the need for polarization insensitivity in the second stage tunable wavelength converter 11 by using a polarization insensitive semiconductor optical amplifier 38 in the first stage and preserving the polarization of the intermediate wavelength when coupling to the second stage. Not having to be polarization insensitive greatly simplifies the active region growth and improves the tunable laser performance.

The general approach illustrated in FIG. 2 can also be implemented in a monolithic device by performing the first stage conversion using counter propagating cross gain modulation within an semiconductor optical amplifier 38 integrated on chip 26. A diagram illustrating the layout of such an integrated device is shown in FIG. 3. In this case, the input wavelength travels in the opposite direction to the intermediate wavelength and the output wavelength This implementation eliminates the need for the intermediate wavelength filter, however it requires full polarization insensitivity in all the semiconductor optical amplifier's 16, 18 and 38 on the chip 26. FIG. 2 is a block diagram in which non-integrated components are used, namely filters which cannot be easily integrated monolithically. FIG. 3 is a monolithic version of an analogous optical circuit to that shown in FIG. 2. If one wanted to describe the operation of FIG. 3 as a block diagram, it would that shown in FIG. 2 except the input signal, $\lambda_i$, would be injected after SOA 38, however, and is sent towards SOA 38 (i.e. in the opposite direction of the arrows in FIG. 2). In the integrated case in FIG. 3, 1510 nm pass filter 44 is no longer necessary because the input signal does not need to be blocked from reaching the tunable wavelength converter stage 11.

Many alterations and modifications may be made by those having ordinary skill in the art without departing from the spirit and scope of the invention. Therefore, it must be understood that the illustrated embodiment has been set forth only for the purposes of example and that it should not be taken as limiting the invention as defined by the following claims. For example, notwithstanding the fact that the elements of a claim are set forth below in a certain combination, it must be expressly understood that the invention includes other combinations of fewer, more or different elements, which are disclosed in above even when not initially claimed in such combinations.

The words used in this specification to describe the invention and its various embodiments are to be understood not only in the sense of their commonly defined meanings, but to include by special definition in this specification structure, material or acts beyond the scope of the commonly defined meanings. Thus if an element can be understood in the context of this specification as including more than one meaning, then its use in a claim must be understood as being generic to all possible meanings supported by the specification and by the word itself.

The definitions of the words or elements of the following claims are, therefore, defined in this specification to include not only the combination of elements which are literally set forth, but all equivalent structure, material or acts for performing substantially the same function in substantially the same way to obtain substantially the same result. In this sense it is therefore contemplated that an equivalent substitution of two or more elements may be made for any one of the elements in the claims below or that a single element may be substituted for two or more elements in a claim. Although elements may be described above as acting in certain combinations and even initially claimed as such, it is to be expressly understood that one or more elements from a claimed combination can in some cases be excised from the combination and that the claimed combination may be directed to a subcombination or variation of a subcombination.

Insubstantial changes from the claimed subject matter as viewed by a person with ordinary skill in the art, now known or later devised, are expressly contemplated as being equivalently within the scope of the claims. Therefore, obvious substitutions now or later known to one with ordinary skill in the art are defined to be within the scope of the defined elements.

The claims are thus to be understood to include what is specifically illustrated and described above, what is conceptionally equivalent, what can be obviously substituted and also what essentially incorporates the essential idea of the invention.

We claim:

1. An apparatus comprising:
    a semiconductor heterostructure;
    an optically isolated tunable laser fabricated in semiconductor heterostructure, said tunable laser having an output;
    an interferometer having an input coupled to said output of said tunable laser, said interferometer monolithically fabricated with said tunable laser in said semiconductor heterostructure;
    where an input signal, $\lambda_i$, is coupled thereto and further comprising:
    a distributed feedback laser having an output to modulate said input signal, $\lambda_i$;
    a semiconductor optical amplifier having an output and an input coupled to said input signal, $\lambda_i$, and to said output of said distributed feedback laser;
    a notch filter having an output and an input coupled to said output of said semiconductor optical amplifier;
    an output of said interferometer;
    an input of said interferometer coupled to said output of said notch filter; so that said input signal, $\lambda_i$, is converted to a desired wavelength via cross phase modulation.

2. The apparatus of claim 1 where said semiconductor optical amplifier having an output and an input coupled to said input signal, $\lambda_i$, is polarization insensitive, and where said interferometer is operated at a fixed polarization of an intermediate wavelength.

3. An apparatus of claim 1, wherein the semiconductor optical amplifier is such as to enable the input signal λi to modulate the output of the distributed feedback laser through cross gain modulation; wherein the notch filter is such as to enable a wavelength corresponding to the output of the distributed feedback laser; and whereby said input of said interferometer is converted to an intermediate wavelength through cross gain modulation and said intermediate wavelength is converted to a desired wavelength via cross phase modulation.

4. An apparatus comprising:
a semiconductor heterostructure;
an optically isolated tunable laser fabricated in semiconductor heterostructure, said tunable laser having an output;
an interferometer having an input coupled to said output of said tunable laser, said interferometer monolithically fabricated with said tunable laser in said semiconductor heterostructure;
where an input signal, $\lambda_i$, is coupled thereto and further comprising:
a distributed feedback laser having an output to modulate said input signal, $\lambda_i$;
a semiconductor optical amplifier having an output coupled to said input signal, $\lambda_i$ and an input coupled to said output of said distributed feedback laser;
an output of said interferometer;
an input of said interferometer coupled to said output of said optical amplifier; so that said input signal, $\lambda_i$, is converted to an intermediate wavelength via counter propagating cross gain modulation; and then to a desired wavelength through cross phase modulation;
and a comb filter having an input coupled to said output of said interferometer.

5. An apparatus comprising:
a semiconductor heterostructure;
an optically isolated tunable laser fabricated in semiconductor heterostructure, said tunable laser having an output;
an interferometer having an input coupled to said output of said tunable laser, said interferometer monolithically fabricated with said tunable laser in said semiconductor heterostructure;
where an input signal, $\lambda_i$, is coupled thereto and further comprising:
a distributed feedback laser having an output signal that is modulated by said input signal, $\lambda_i$;
a semiconductor optical amplifier configured for cross gain modulation having an output coupled to said input signal, $\lambda_i$ and an input coupled to said output of said distributed feedback laser;
an output of said interferometer;
an input of said interferometer coupled to said output of said cross gain modulation semiconductor optical amplifier; so that said input signal, $\lambda_i$, is converted to an intermediate wavelength λ via counter propagating cross gain modulation; and said intermediate wavelength is converted to a desired wavelength via cross phase modulation;
and a comb filter having an input coupled to said output of said interferometer.

* * * * *